(12) United States Patent
Lee et al.

(10) Patent No.: US 11,289,880 B2
(45) Date of Patent: Mar. 29, 2022

(54) LIGHT SOURCE PACKAGE STRUCTURE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Wen Lee, Shiyan (CN); Hsiang-Chih Hung, Pingtung County (TW); Shu-Hua Yang, Taichung (TW); Yu-Hung Su, Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 44 days.

(21) Appl. No.: 16/868,831

(22) Filed: May 7, 2020

(65) Prior Publication Data

US 2020/0358250 A1    Nov. 12, 2020

(30) Foreign Application Priority Data

May 7, 2019 (CN) .......................... 201910378781.0
Jan. 3, 2020 (CN) .......................... 202010004751.6

(51) Int. Cl.
*H01S 5/183* (2006.01)
*H01L 33/46* (2010.01)
(Continued)

(52) U.S. Cl.
CPC .......... *H01S 5/18302* (2013.01); *C09K 19/38* (2013.01); *C09K 19/54* (2013.01); *G02F 1/133711* (2013.01); *H01L 33/46* (2013.01); *H01S 5/18327* (2013.01); *H01S 5/18366* (2013.01); *C09J 163/00* (2013.01); *C09J 2301/416* (2020.08); *C09K 2019/521* (2013.01);
(Continued)

(58) Field of Classification Search
CPC ............ H01S 5/18302; H01S 5/18366; H01S 5/18327; H01L 33/46; C09K 19/38; C09K 19/54; C09K 2019/521; G02F 1/133711; G02F 2202/28; C09J 2301/416; C09J 163/00
USPC .................. 372/39; 257/432, 98, 99; 134/26
See application file for complete search history.

(56) References Cited

U.S. PATENT DOCUMENTS

| 2007/0221253 A1* | 9/2007 | Nishikido | ............ H01L 21/6715 134/26 |
| 2013/0234274 A1* | 9/2013 | Kam | ....................... H01L 33/58 257/432 |
| 2018/0040780 A1* | 2/2018 | Hirasawa | .............. H01L 33/486 |

\* cited by examiner

*Primary Examiner* — Ruiyun Zhang
(74) *Attorney, Agent, or Firm* — Li & Cai Intellectual Property (USA) Office

(57) ABSTRACT

A light source package structure is provided. The light source package structure includes a substrate, an upper electrode layer, a surrounding wall, a light emitting unit, an adhesive, and a light permeable element. The surrounding wall is annular with step structure and includes an upper tread surface arranged away from the substrate, an upper riser surface connected to an inner edge of the upper tread surface, a lower tread surface disposed at an inner side of the upper riser surface, an accommodating groove disposed between the lower tread surface and the upper riser surface, and a lower riser surface connected to an inner edge of the lower tread surface and arranged away from the upper tread surface. The lower riser surface and the first surface jointly define a receiving space.

20 Claims, 12 Drawing Sheets

(51) Int. Cl.
*G02F 1/1337* (2006.01)
*C09K 19/54* (2006.01)
*C09K 19/38* (2006.01)
 C09K 19/52  (2006.01)
 C09J 163/00 (2006.01)
(52) U.S. Cl.
 CPC ...... *C09K 2323/00* (2020.08); *G02F 2202/28* (2013.01)

LIGHT SOURCE PACKAGE STRUCTURE

CROSS-REFERENCE TO RELATED PATENT APPLICATION

This application claims the benefit of priority to China Patent Application No. 202010004751.6, filed on Jan. 3, 2020, and No. 201910378781.0, filed on May 7, 2019, in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light source package structure, and more particularly to a light source package structure with a novel type package structure.

BACKGROUND OF THE DISCLOSURE

Conventional light source package structures mostly use a TO-CAN (Transistor Outline-CAN) package structure. However, as there have been no major structural improvements in recent years, the conventional light source package structures have become increasingly difficult to meet various requirements.

SUMMARY OF THE DISCLOSURE

In response to the above-referenced technical inadequacies, the present disclosure provides a light source package structure to effectively improve on the issues associated with conventional light source package structures.

Therefore, the light source package structure of the present disclosure provides a structure that is different from a TO-CAN (Transistor Outline-CAN) package structure to meet different requirements today. Further, the surrounding wall of the light source package structure of the present disclosure is made of the liquid crystal polymer. The liquid crystal polymer has less polar groups so that the liquid crystal polymer can provide excellent oxygen/water vapor isolation capacity and a high temperature resistance. Furthermore, the liquid crystal polymer of the surrounding wall of the light source package structure has low dielectric constant so that the light source package structure can be widely implemented in a high power package and high frequency applications.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
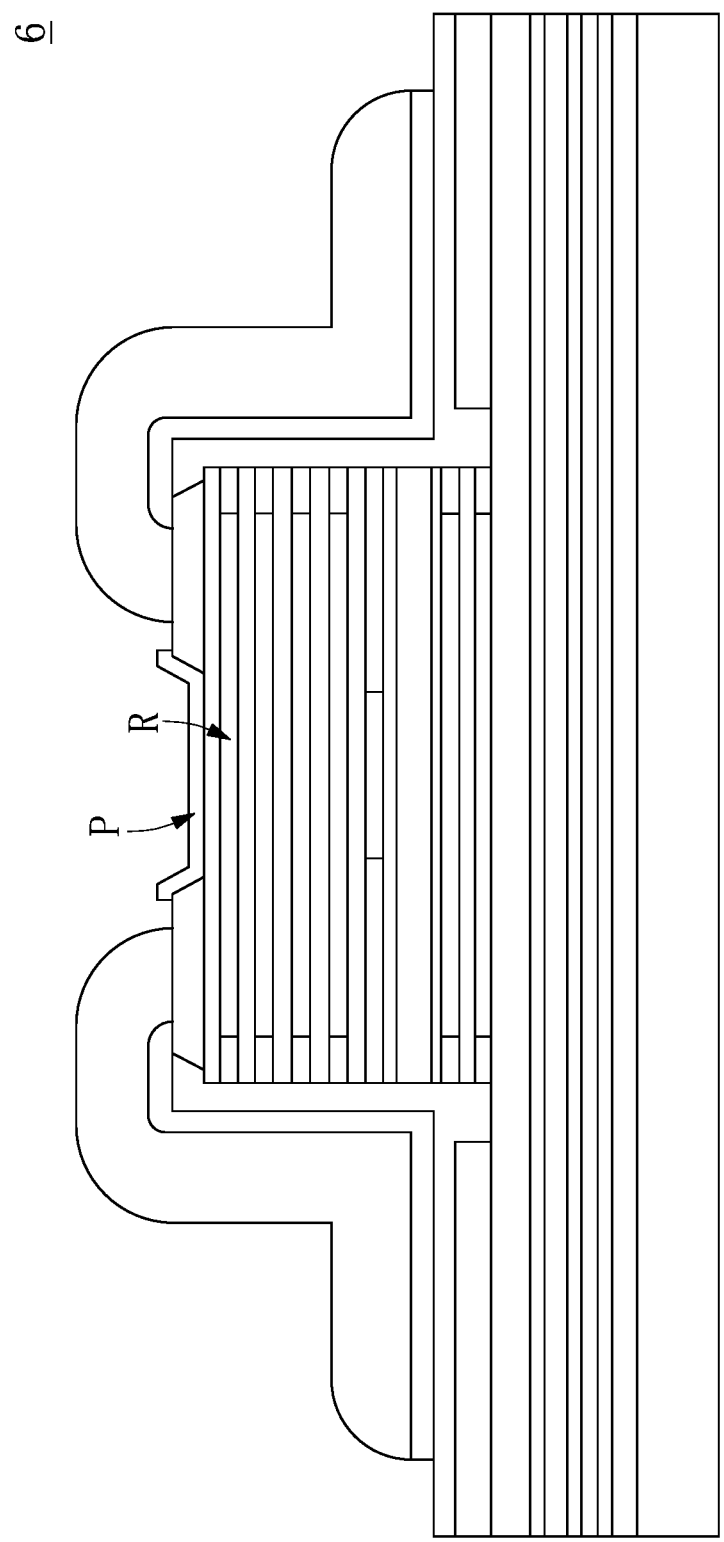
FIG. 1 is a cross-sectional view of a vertical cavity surface emitting laser (VCSEL) according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 10, an embodiment of the present disclosure provides a light source package structure 100, and more particularly to a light source package structure 100 for a 3D sensing, such as the light source package structure 100 applying a vertical cavity surface emitting laser (VCSEL) light source or an infrared light source, but the present disclosure is not limited thereto. For example, the light source package structure 100 can also apply a LED or a laser.

Figure 2A:
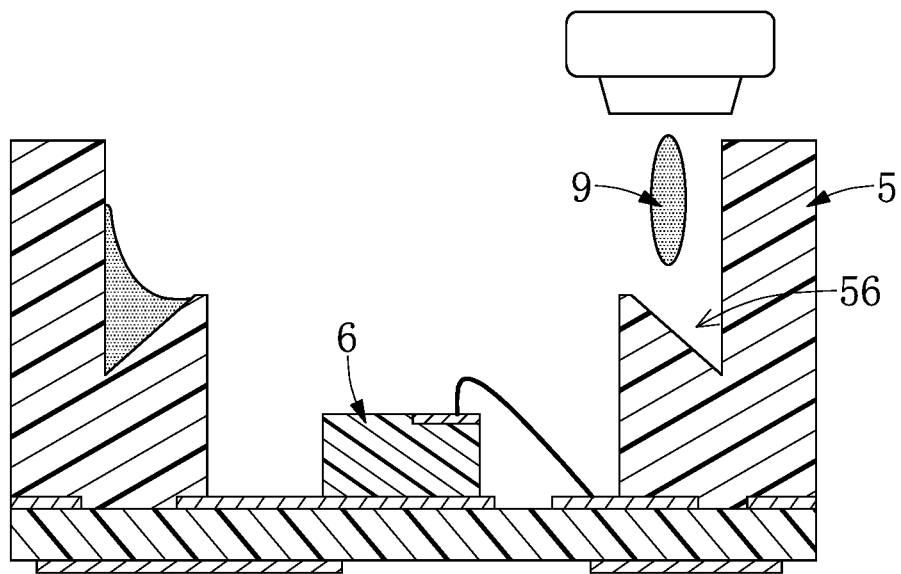
FIGS. 2A-2C are schematic views showing a surrounding wall of a light source package structure made of a liquid crystal polymer according to the present disclosure.
Figure 2B:
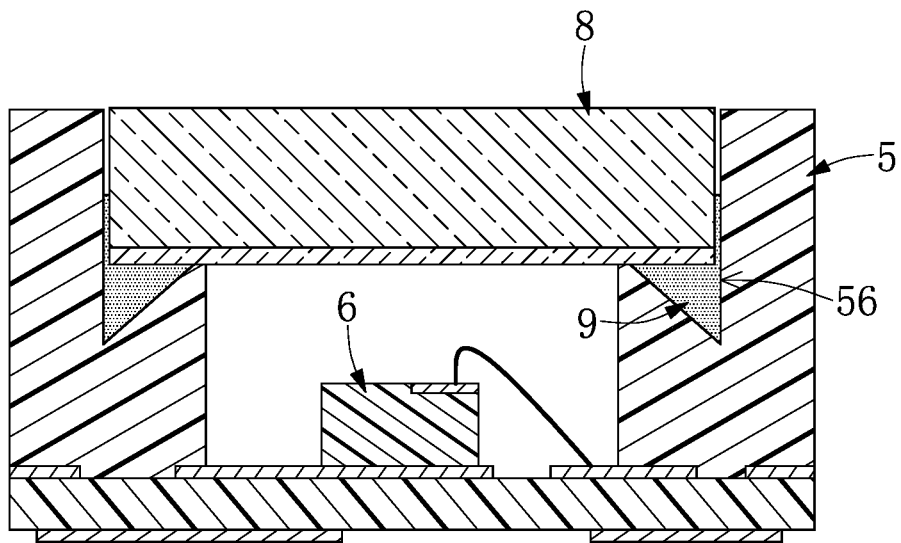
Figure 2C:
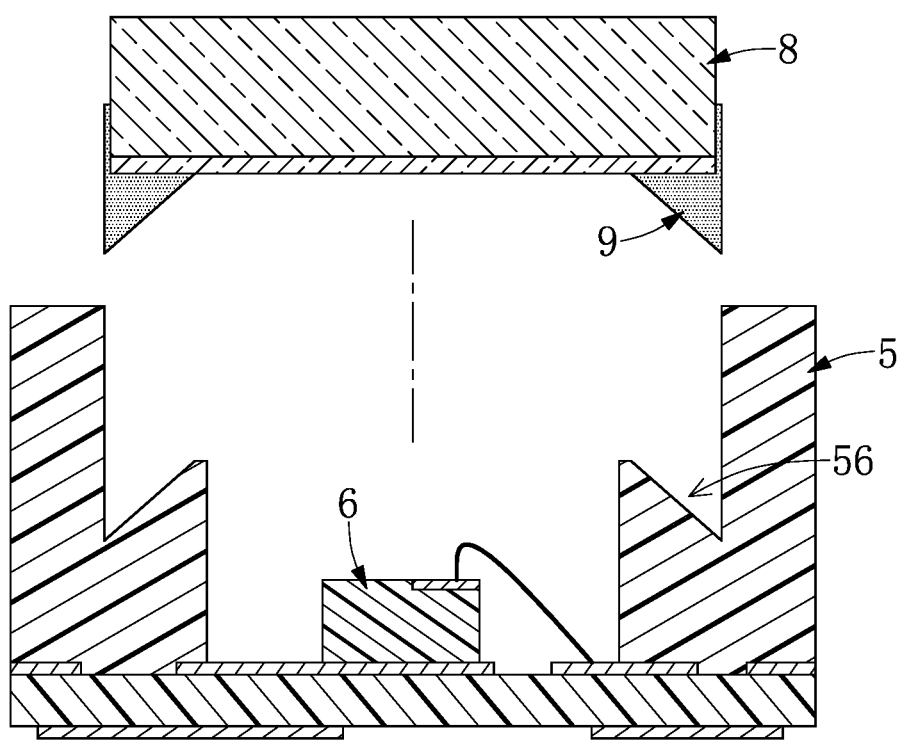

A liquid crystal polymer material has a locally ordered molecular structure, less polar groups, an excellent isolation ability to block oxygen/water vapor, and a high temperature resistance. Furthermore, the liquid crystal polymer has low dielectric constant, so that it is quite suitable for high power package and high frequency applications. When a package structure for the vertical cavity surface emitting laser 6 described above applies a surrounding wall 5 made of the liquid crystal polymer of FIG. 2A, an adhesive 9 is filled within an accommodating groove 56 of the surrounding wall 5 so as to adhere a light permeable element 8 to the surrounding wall 5 (as shown in FIG. 2B and FIG. 2C), and then the adhesive 9 is cured by a UV light or heating.

The liquid crystal polymer material can be a composite material. For example, at least one of a glass fiber, a titanium dioxide, and a silicon dioxide can be added into the liquid crystal material to improve strength and thermal conductivity of the liquid crystal polymer material, such that volume shrinkage of the liquid crystal polymer material can be reduced.

As shown in FIG. 1, a surface of the vertical cavity surface emitting laser 6 has an insulation protective layer P having a thickness of about 10 nm to 100 nm or less, and the insulation protective layer P is coated on a surface of a distributed Bragg reflector (DBR) layer R. A plasma processing is implemented in an Ar/H2 mixed gas environment, and inert gas argon ions would bombard the insulation protective layer P. Accordingly, the insulation protective layer P and the DBR layer R are damaged (e.g., etched) so that a final reliability and performances of the insulation protective layer P and the DBR layer R are affected. Therefore, the vertical cavity surface emitting laser 6 is not suitable for the plasma processing. However, under a premise that the plasma processing is not applied to the vertical cavity surface emitting laser 6, a surface of the surrounding wall 5 is not easily adhered thereon. Accordingly, a poor adhesion between the light permeable element 8 and the surrounding wall 5 is provided, and the light permeable element 8 will fall off during a thermal cycling and a thermal shock test.

Figure 5:
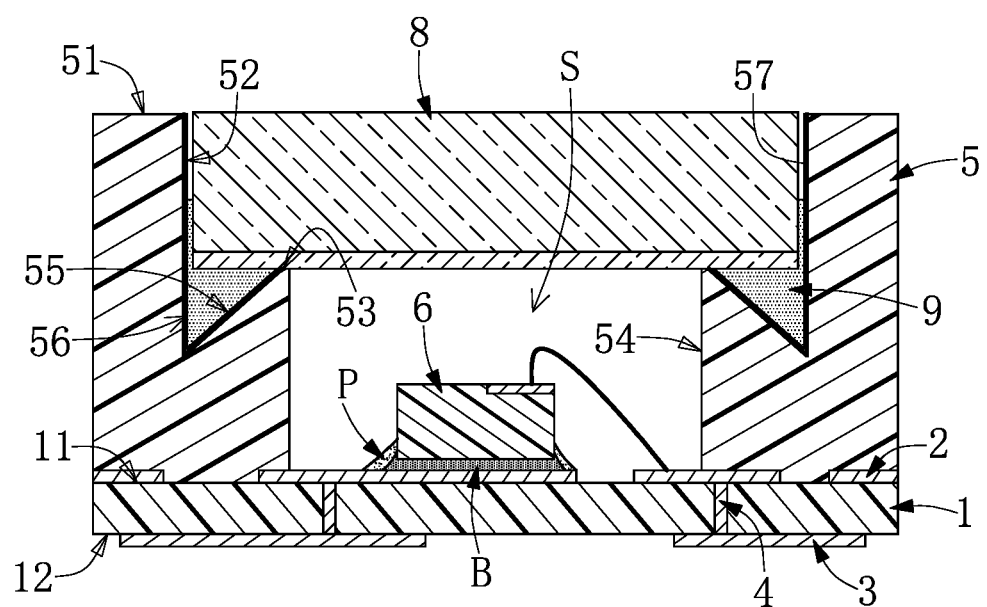
FIG. 5 is a cross-sectional view of FIG. 3.

In addition, the number of the polar groups on the surface of the surrounding wall 5 is relatively less, that is, the material of the surrounding wall 5 is a low surface energy material. Accordingly, problems such as a difficulty in wetting of the adhesive 9 (i.e., a bubble problem) and a low connection strength with the adhesive 9 (i.e., a reliability problem) are existed. Therefore, without harming a structure of the vertical cavity surface emitting laser 6, the present disclosure provides an active molecular layer containing polar groups to increase a binding force with the surrounding wall 5. For example, a surface treatment, such as an ultraviolet treatment or an ultraviolet ozone (UVO) treatment, can be implemented on the surrounding wall 5, so that the active molecular layer 57 (as shown in FIG. 5) is formed on an inner surface of the surrounding wall 5, but the present disclosure is not limited thereto. The UV treatment or the UVO treatment is implemented by preferably using a UV light having a wavelength of 180-365 nm, and an irradiation energy of the UV light is greater than a bonding energy of at least one of a carbon-carbon bond (C—C), a carbon-hydrogen bond (C—H), and a carbon-carbon bond (π-π*) in a benzene ring of the liquid crystal polymer.

Figure 6:
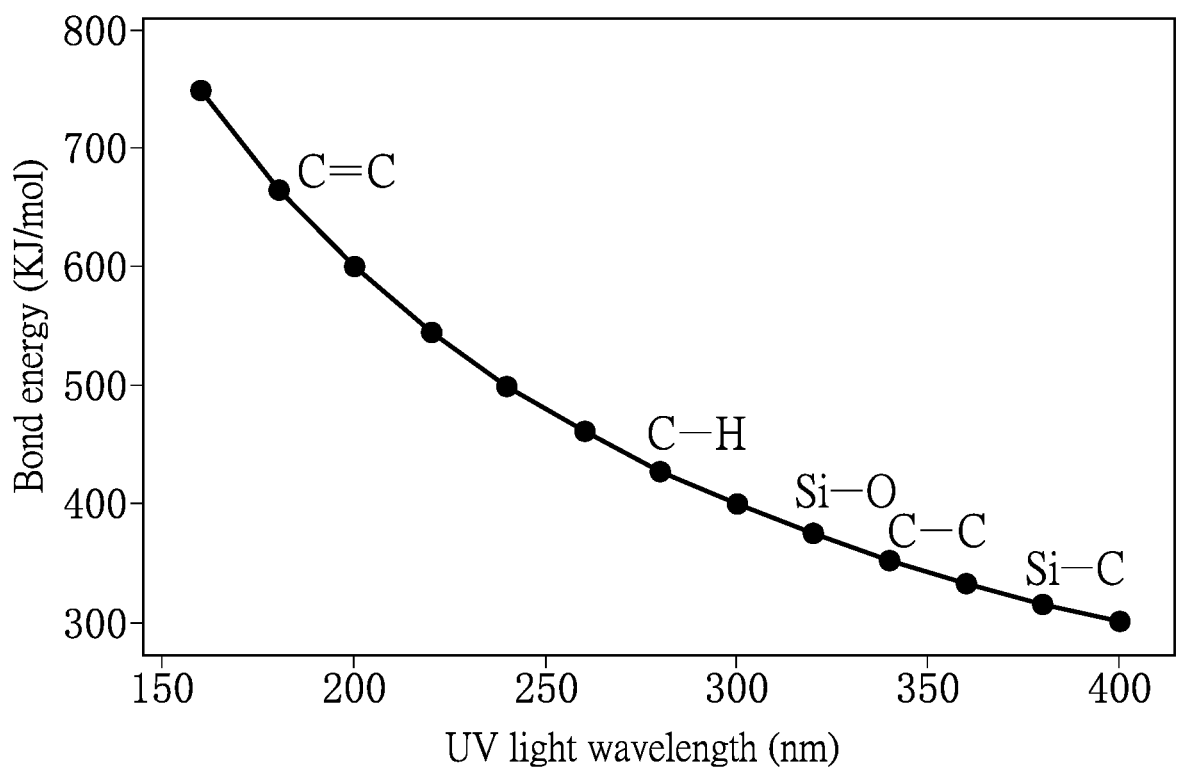
FIG. 6 is a relationship chart comparing between a UV wavelength and a bond energy.

A method where the surface treatment is implemented by the UV treatment to form the active molecular layer 57 on the surrounding wall 5 is described as follows:

First, the surrounding wall 5 (including a substrate and the vertical cavity surface emitting laser 6) is dried and dehumidified, and then irradiated with the UV light having the wavelength of 180 to 365 nm. The wavelength of the UV light satisfies the following condition: irradiation energy of UV light>bonding energy. For example, the surface of the surrounding wall 5 has C—H bonds (413 kJ/mol) and C—C bonds (348 kJ/mol) so that the irradiation energy must meet E UV light>348 kJ/mol (the table in FIG. 6 shows that a corresponding optimal wavelength λ<350 nm).

A method where the surface treatment is implemented by the UV treatment and the UVO treatment to form the active molecular layer 57 on the surrounding wall 5 is described as follows:

First, the surrounding wall 5 (including the substrate and the vertical cavity surface emitting laser 6) is dried and dehumidified, and then irradiated with the UV light having a wavelength of about 185 nm and a UV light with a wavelength of about 250 nm (that is, a low-pressure UV mercury lamp can emit a combination of the UV light with the wavelength of 185 nm and a UV light with a wavelength of 254 nm to modified the surface of the surrounding wall 5). Accordingly, the UV light/ozone/monoatomic oxygen can work together on the C—H bonds and the C—C bonds and break the C—H bonds and the C—C bonds, so that C—OH bonds and —COO bonds are produced. Accordingly, the active molecular layer 57 has a significantly improved surface energy and increased polar groups. The above process is expressed as follows:

  (1)

  (2)

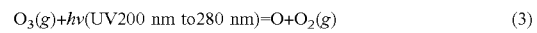  (3)

(4)
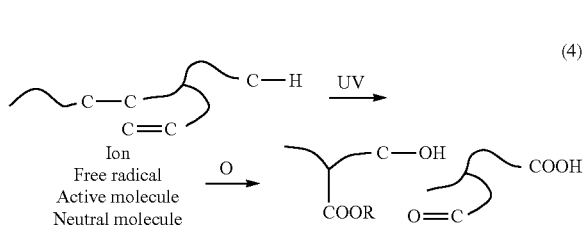

The UV light with the wavelength of about 185 nm can be absorbed by an oxygen molecule $O_2$ and react to generate the monoatomic oxygen O. The monoatomic oxygen O can continue to react with the oxygen molecule $O_2$ to generate the ozone $O_3$, as shown in reactions (1) and (2) above. The UV light with the wavelength of about 250 nm can be absorbed by the ozone $O_3$ and react to generate the monoatomic oxygen O. On the other hand, surface organics or pollutants can also absorb the above-mentioned UV light so that chemical bonds of the surface organics or the pollutants are broke to generate ions, free radicals or active molecules. Some of the free radicals, the active molecules or the ions can react with the monoatomic oxygen O to generate volatile small molecules, such as $H_2O$, $CO_2$, etc., or generate polar chemical bonds such as the C—OH bonds and the —COO bonds.

Figure 7A:
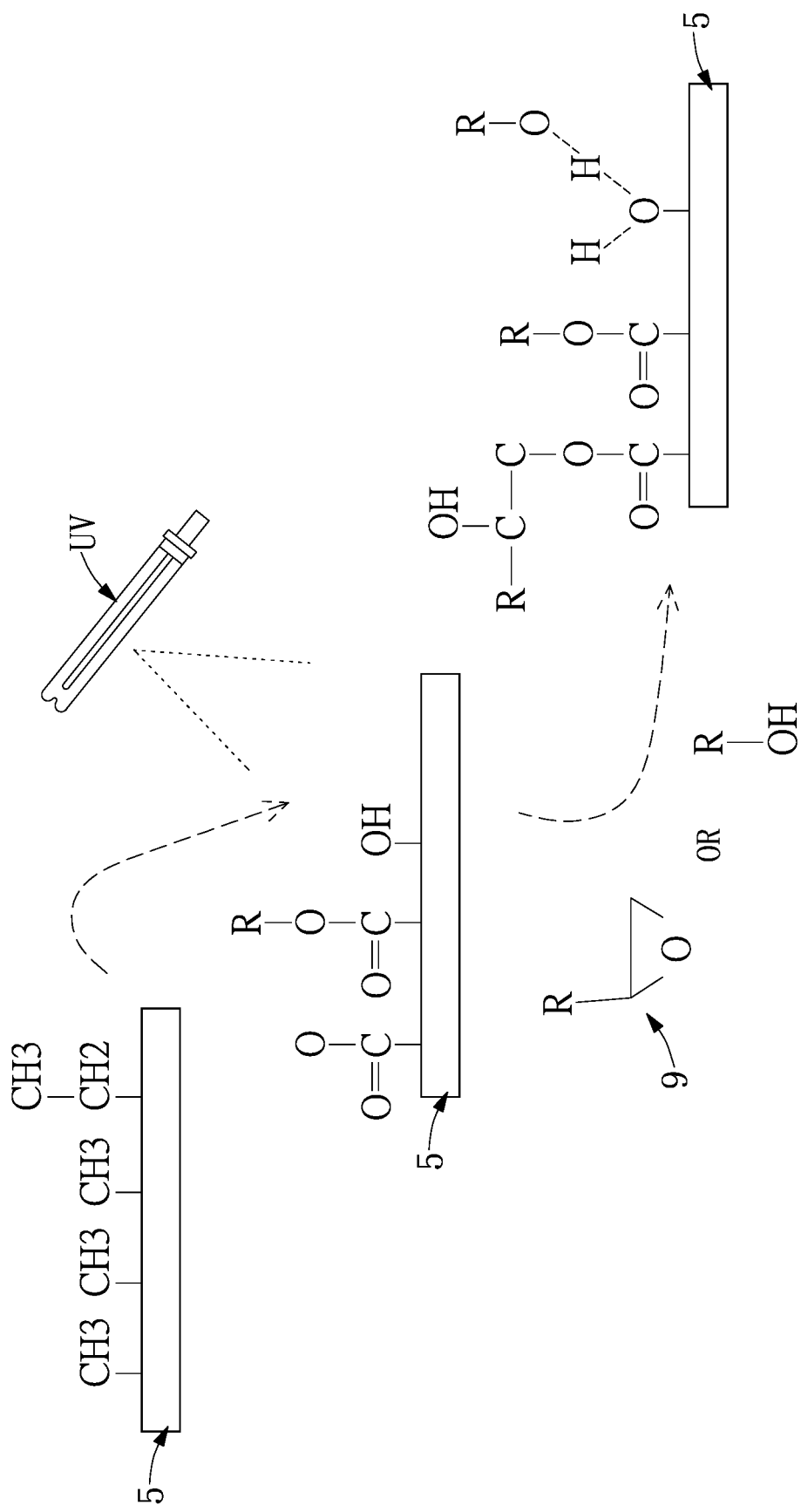
FIGS. 7A-7B are schematic views of an adhesion enhancement between the surrounding wall and the adhesive (e.g., an epoxy resin adhesive).
Figure 7B:
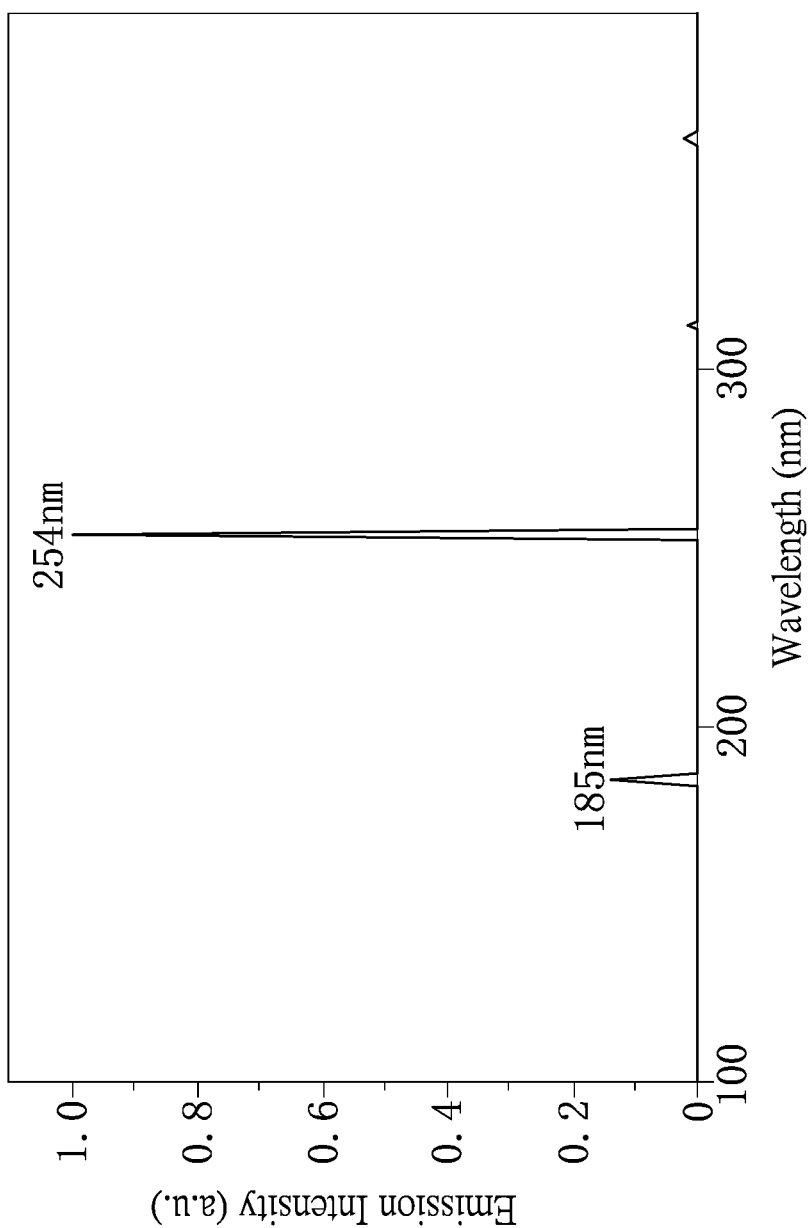

Specifically, FIG. 7A and FIG. 7B are schematic views of an enhanced adhesion between the surrounding wall 5 and the adhesive 9 (such as an epoxy resin). The adhesion between the adhesive 9 and the surrounding wall 5 can be increased by a C—O bond and a hydrogen bond in an ester group after implementing the UV/UVO surface treatment on the surrounding wall 5.

The specific implementation of the present disclosure is described as follows, but it is not limited thereto. First, the surrounding wall 5 is placed in a UV light box to be treated with UV light, and a distance between the surface of the surrounding wall 5 and a UV light source is set at a distance of about 10 cm. A central value of an emission intensity of the UV light source is about 150 mW/cm2, and an irradiation time of the UV light source is set to 200 seconds. An epoxy-based UV adhesive 9 is injected into the accommodating groove 56 of the surrounding wall 5, and then the light permeable element 8 is covered and put in the surrounding wall 5. Finally, the surrounding wall 5 is irradiated for 200 seconds by the UV light box. Accordingly, an appearance of the surrounding wall 5 is not significantly discolored, a surface roughness of the surrounding wall 5 is almost unchanged (Ra is about 0.31 to 0.36 microns), and a push force is increased by >8%. When the surface of the surrounding wall 5 is not irradiated by the UV light source, the light permeable element 8 falls off from the surrounding wall 5.

Figure 3:
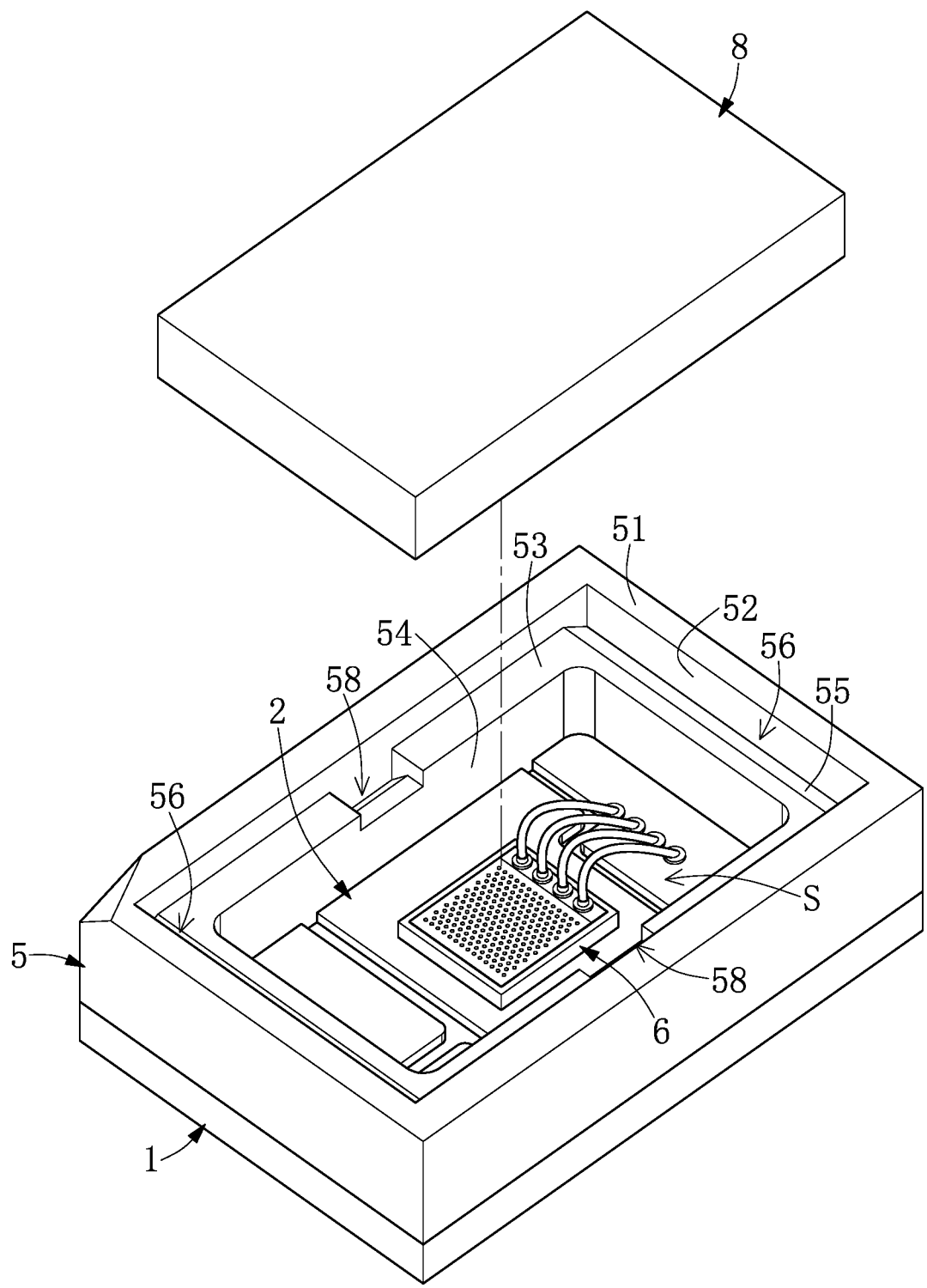
FIG. 3 is a perspective view of the light source package structure according to an embodiment of the present disclosure.
Figure 4:
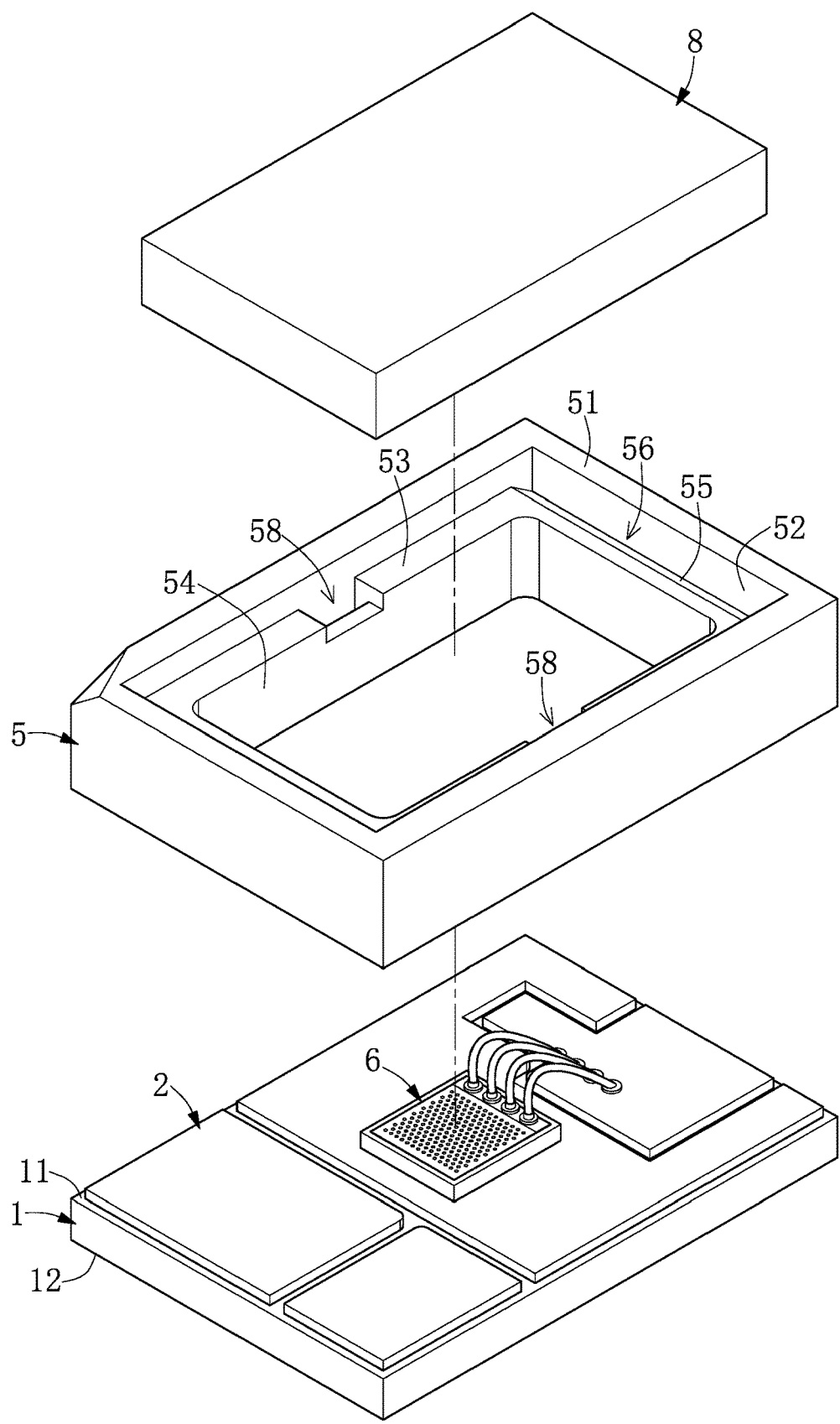
FIG. 4 is an exploded view of FIG. 3 when an adhesive is omitted.

Accordingly, the present embodiment discloses a light source package structure 100 (as shown in FIGS. 3 to 5) including a substrate 1, an upper electrode layer 2 disposed on a side of the substrate 1, a lower electrode layer 3 disposed on an opposite side of the substrate 1, a plurality of conducting pillars 4 embedded inside of the substrate 1, a surrounding wall 5 disposed on the substrate 1, a light emitting unit 6 mounted on the upper electrode layer 2, a light permeable element 8 disposed on the surrounding wall 5, and an adhesive 9 connecting and fixing the light permeable element 8 and the surrounding wall 5.

The substrate 1 is substantially a rectangular shape (such as a rectangle shape or a square shape) in the present embodiment. The substrate 1 of the present embodiment is a ceramic substrate and includes a first surface 11 and a second surface 12 that is opposite to the first surface 11. The material of the substrate 1 is not limited to the ceramic, and the material of the substrate 1 can also be a circuit board or other insulating substrate.

The upper electrode layer 2 is disposed on the first surface 11 of the substrate 1, and the lower electrode layer 3 is disposed on the second surface 12 of the substrate 1. The conducting pillars 4 are embedded inside of the substrate 1. Each of the conducting pillars 4 has two ends that are respectively connected to the upper electrode layer 2 and the lower electrode layer 3, so that the upper electrode layer 2 can be electrically connected to the lower electrode layer 3 through the plurality of conducting pillars 4.

The surrounding wall 5 is made of the liquid crystal polymer and disposed on the first surface 11 of the substrate 1. An outer edge of the surrounding wall 5 is coplanar with an outer edge of the substrate 1, and a peripheral part of the upper electrode layer 2 is sandwiched between the above-mentioned surrounding wall 5 and the substrate 1. The surrounding wall 5 is annular with a step structure, and the surrounding wall 5 of the present embodiment is a one-piece molded structure, but the present disclosure is not limited thereto.

Specifically, the surrounding wall 5 includes an upper tread surface 51, an upper riser surface 52 connected to an inner edge of the upper tread surface 51, a lower tread surface 53, and a lower riser surface 54 connected to an inner edge of the lower tread surface 53, each of the above mentioned elements (i.e., 51-54) are sequentially arranged from an outside to an inside of the surrounding wall 5. Furthermore, in the present embodiment, the surrounding wall 5 includes two inclined surfaces 55 that are respectively connected to the upper riser surface 52 and the lower tread surface 53, and the two inclined surfaces 55 are respectively connected to two opposite sides of the lower tread surface 53 (e.g., two short edges of the lower tread surface 53 in FIG. 4).

The upper tread surface 51 is a square annular shape (such as a rectangular annular shape or a square annular shape) and is arranged away from the substrate 1. The upper tread surface 51 in the present embodiment is a top surface of the surrounding wall 5, and the upper tread surface 51 is preferably parallel to the first surface 11 of the substrate 1. The upper riser surface 52 is a square annular shape and is vertically connected to the inner edge of the upper tread surface 51. The lower tread surface 53 is preferably parallel to the upper tread surface 51, and a distance between the lower tread surface 53 and the first surface 11 is less than a distance between the upper tread surface 51 and the first surface 11. The lower riser surface 54 is a square annular shape. The lower riser surface 54 is vertically connected to an inner edge of the lower tread surface 53 and is arranged away from the upper tread surface 51. The lower riser surface 54 and the first surface 11 of the substrate 1 jointly define a receiving space S.

Furthermore, one side of each of the two inclined surfaces 55 (e.g., an inner edge of each of the inclined surfaces 55 in FIG. 5) is connected to the lower tread surface 53 to form an angle greater than 90 degrees, and the other side of each of the two inclined surfaces 55 (e.g., an outer edge of each of the inclined surfaces 55 in FIG. 5) and the upper riser surface 52 jointly form an accommodating groove 56 that has an angle less than 90 degrees. That is, positions of the two accommodating grooves 56 of the surrounding wall 5 are opposite to each other, but the present disclosure is not limited thereto. For example, in other embodiments not shown, the surrounding wall 5 can include at least one inclined surface 55 and at least one accommodating groove 56 corresponding in position to the at least one inclined surface 55. That is, the accommodating groove 56 is disposed between the lower tread surface 53 and the upper riser surface 52.

In addition, the surrounding wall 5 has two notches 58 that are recessed from the lower tread surface 53 and the lower riser surface 54 and that are in spatial communication with the receiving space S. The two notches 58 are arranged opposite to each other. The two notches 58 of the surrounding wall 5 are preferably to be respectively disposed at a center of the two long edges of the lower tread surface 53. That is, the two accommodating grooves 56 of the surrounding wall 5 and the two notches 58 respectively correspond in position to four edges of the lower tread surface 53, but the present disclosure is not limited thereto. For example, in other embodiments of the present disclosure, the surrounding wall 5 can also have at least one notch 58.

As shown in FIG. 3 to FIG. 7B (the adhesive 9 and the active molecular layer 57 are omitted in FIG. 3 and FIG. 4), in the present embodiment, the light emitting unit 6 is the vertical cavity surface emitting laser (VCSEL) that provides an infrared light. The light emitting unit 6 is disposed inside of the receiving space S, and the light emitting unit 6 preferably corresponds to a center of the first surface 11.

In the present embodiment, the light permeable element 8 is a transparent glass plate and a light-diffusing layer disposed on the transparent glass plate. The light permeable element 8 is disposed on the lower tread surface 53 of the surrounding wall 5 and is spaced apart from the upper riser surface 52 with an interval (that is, the light permeable element 8 does not contact the upper riser surface 52). Accordingly, each of the above-mentioned notches 58 defines an air flow channel that is in spatial communication with the receiving space S and an external space.

Furthermore, in the present embodiment, the light permeable element 8 is fixed on the surrounding wall 5 by the adhesive 9, and the light permeable element 8 and the lower tread surface 53 can be closely integrated with each other by the adhesive 9. A part of the adhesive 9 is disposed inside of each of the accommodating grooves 56 of the surrounding wall 5.

Specifically, as shown in FIG. 5, the active molecular layer 57 containing polar groups is formed on an inside wall of the accommodating groove 56, and the active molecular layer 57 is preferably formed by treating the inside wall of the accommodating groove 56 with a UV treatment or a UV ozone (UVO) treatment. The adhesive 9 is adhered to the active molecular layer 57 by acting on the polar groups of the active molecular layer 57, and the active molecular layer 57 preferably includes at least one of an ester group (O=C—OR), a carboxyl group (—COOH), and a hydroxyl group (—OH). The adhesive 9 includes at least one of an epoxy group and a hydroxyl group that forms a chemical bond with the active molecular layer 57. According to a manufacturing process of the light source package structure 100, before filling in the adhesive 9, the active molecular layer 57 containing the polar groups is formed by treating the inside wall of the accommodating groove 56 with the UV treatment or the UV ozone treatment so that the adhesive 9 adheres to the active molecular layer 57 by acting on the polar groups of the active molecular layer 57. Accordingly, a reliability of the light source package structure 100 is not affected by avoiding the light permeable element 8 falling off due to an insufficient coupling force between the light permeable element 8 and the surrounding wall 5.

In addition, the light source package structure 100 of the present embodiment includes a die-bonding adhesive layer B (e.g., a sintered nano-silver adhesive, a sintered nano-copper adhesive) bonded between the light emitting unit 6 and the upper electrode layer 2. The light source package structure 100 preferably adopts the sintering adhesive for die bonding, such as a sinter Ag. Therefore, the die-bonding adhesive layer B can be used in high temperatures process, and also has a properties of high thermal conductivity and better mechanical strength. It should be noted that the sinter Ag is an important die-bonding material for a high-power or a high-temperature (>150° C.) semiconductor package. In particular, a sinter Ag is more widely used in pressure-less condition. The reason is that (1) the sinter Ag is sintered without any pressure; (2) the sinter Ag is compatible with conventional die-bonding equipment, and is widely used in LED, IGBT and other package processes. The die-bonding process includes: substrate pre-treatment, applying die-bonding adhesive, chip placement, and curing.

Figure 8A:
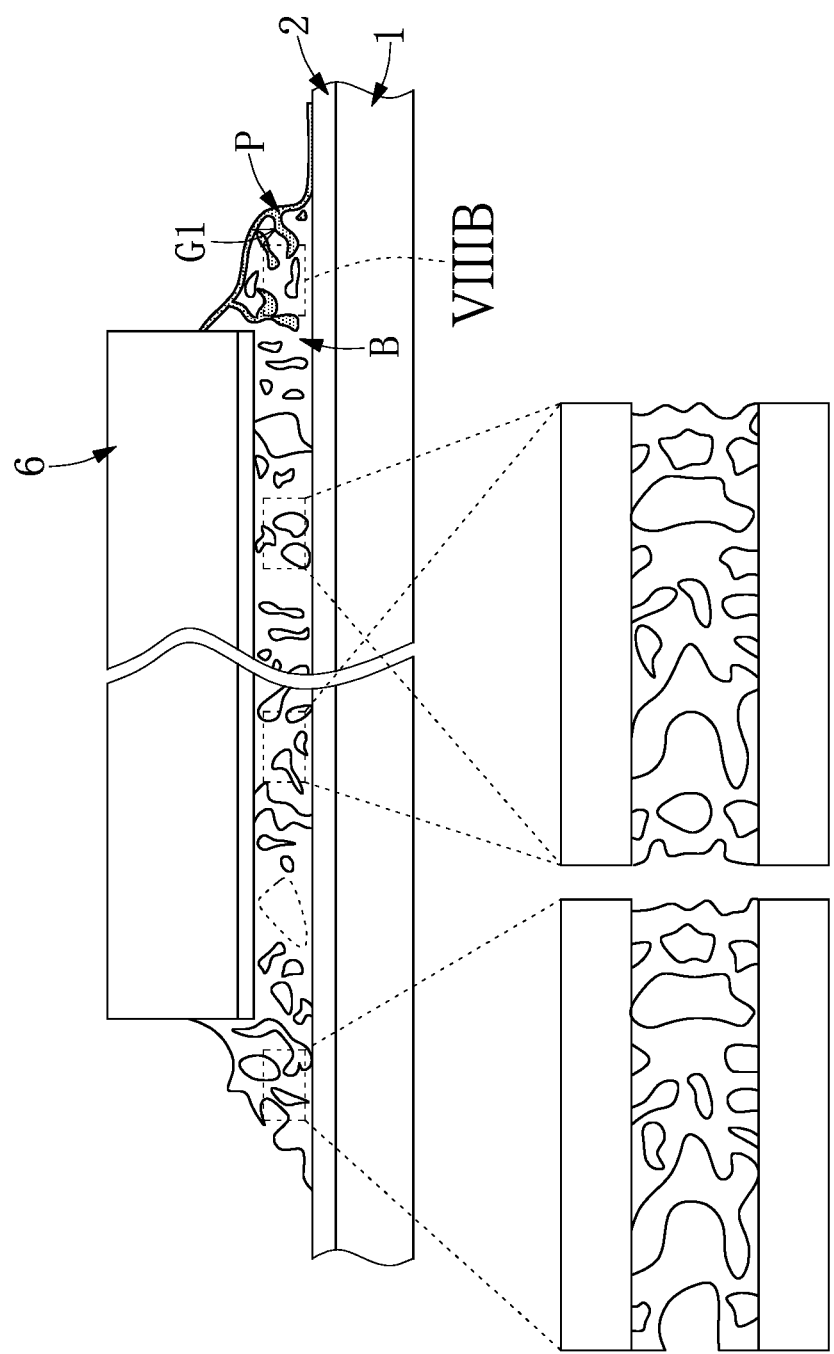
FIGS. 8A-10 are schematic views showing the light source package structure that further has a protective layer.
Figure 8B:
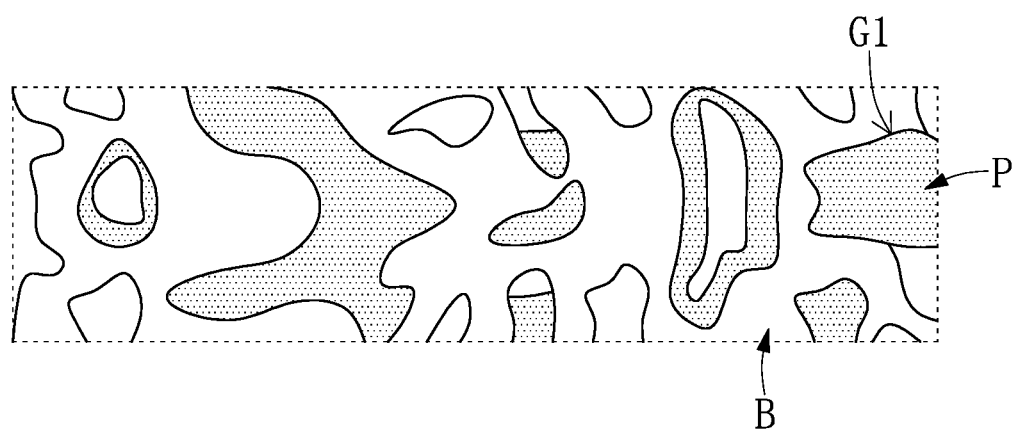
Figure 9:
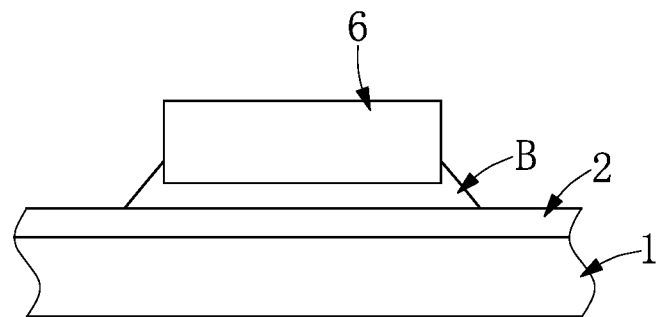
Figure 10:
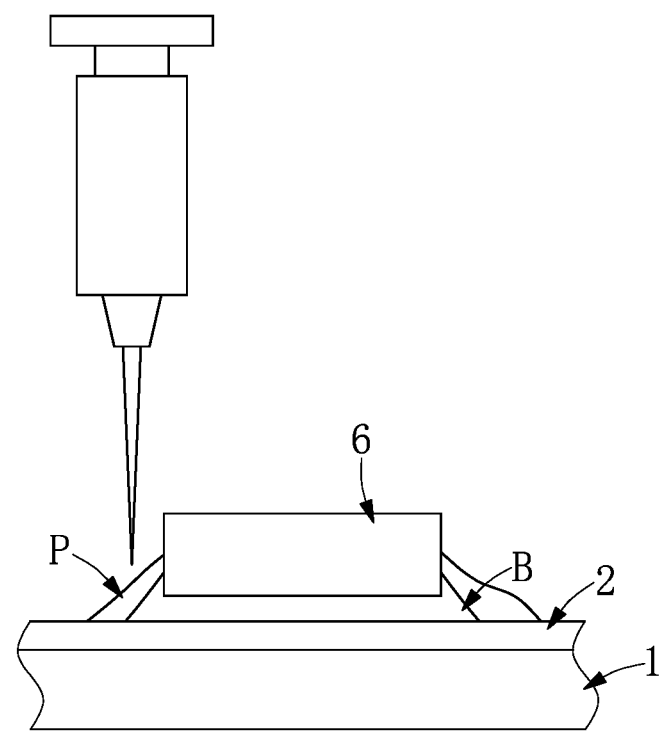

As shown in FIG. 5, FIG. 8A and FIG. 8B, the light source package structure 100 further includes a protective layer P attached to an outer surface of the die-bonding adhesive layer B. The die-bonding adhesive layer B is adhered between the light emitting unit 6 and the upper electrode layer 2, and the die-bonding adhesive layer B has at least one pore G1 extending inwardly from an outer surface thereof. The protective layer P extends inwardly from the outer surface of the die-bonding adhesive layer B into at least one pores G1, so that the protective layer P is filled within a part or an entirety of the at least one pores G1. It should be noted that the protective layer P can be coated on the inside wall of the pore G1 of the die-bonding adhesive layer B to form a hollow structure in the die-bonding adhesive layer B, so that an overall thickness of the die-bonding adhesive layer B can be reduced. In contrast, the protective layer P is completely filled within the pores G1 of the die-bonding adhesive layer B, and the overall thickness of the die-bonding adhesive layer B is greater because of the influence of the protective layer P being completely filled within the pores G1. Accordingly, the die-bonding adhesive layer B has an insufficient reliability due to thermal shock or aging. The protective layer P can be made of high temperature resistant organic materials (such as low-fold silicone), inorganic materials (polysilazane), or inorganic/organic hybrid materials. The protective layer has thermostability when the temperature is larger than 150° C. Furthermore, as shown in FIG. 9 and FIG. 10, the protective layer P is coated after the light emitting unit 6 is disposed on the die-bonding adhesive layer B and die-bonding adhesive layer B is cured. The present disclosure also uses the protective layer P to prevent external harmful gases (such as a water vapor and a sulfur-containing air) from entering inside of the die-bonding adhesive layer B and leading to potential hazards such as oxidation/sulfidation/silver migration, which may cause problems such as a thrust force reduction and a delamination and thereby affecting the package reliability.

In summary, the surrounding wall of the light source package structure of the present disclosure is made of the liquid crystal polymer to provide excellent ability to block oxygen/water vapor and excellent ability on the high temperature resistance. Furthermore, since the number of the polar groups on the surface of the surrounding wall is relatively fewer and the surface of the surrounding wall belongs to the low surface energy substance, the active molecular layer containing the polar groups can be formed on the inside wall of the accommodating groove in the light source package structure of the instant disclosure, so that the adhesive can adhere to the active molecular layer by acting on the polar groups. Accordingly, the light permeable element is firmly fixed on the surrounding wall.

In conclusion, the light source package structure of the present disclosure implements a structure that is different from the TO-CAN (Transistor Outline-CAN) package structure to meet different requirements. Further, the surrounding wall of the light source package structure of the present disclosure is made of the liquid crystal polymer. The liquid crystal polymer has less polar groups so that the liquid crystal polymer can provide excellent oxygen/water vapor isolation capacity and the high temperature resistance. Furthermore, the liquid crystal polymer of the surrounding wall of the light source package structure has low dielectric constant so that the light source package structure can be widely implemented in a high power package and high frequency applications.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:
1. A light source package structure, comprising:
   a substrate including a first surface and a second surface that is opposite to the first surface;
   an upper electrode layer disposed on the first surface of the substrate;

a surrounding wall made of a liquid crystal polymer and disposed on the first surface, and the surrounding wall being annular with a step structure, the surrounding wall including:
   an upper tread surface arranged away from the substrate;
   an upper riser surface connected to an inner edge of the upper tread surface;
   a lower tread surface disposed at an inner side of the upper riser surface, wherein a distance between the lower tread surface and the first surface is less than a distance between the upper tread surface and the first surface;
   at least one accommodating groove disposed between the upper riser surface and an outer edge of the lower tread surface; and
   a lower riser surface connected to an inner edge of the lower tread surface and arranged away from the upper tread surface, wherein the lower riser surface and the first surface jointly define a receiving space;
a light emitting unit mounted on the upper electrode layer and disposed inside of the receiving space;
an adhesive disposed in the at least one accommodating groove; and
a light permeable element disposed on the lower tread surface, wherein the light permeable element is fixed on the surrounding wall by the adhesive;
wherein the surrounding wall has at least one notch that is recessed from the lower tread surface and the lower riser surface and that is in spatial communication with the receiving space, and the at least one notch defines an air flow channel that is in spatial communication with the receiving space and an external space.

2. The light source package structure according to claim 1, wherein the surrounding wall includes an active molecular surface containing polar groups and formed on an inside wall of the at least one accommodating groove, and the adhesive adheres to the active molecular surface by acting on the polar groups of the active molecular surface.

3. The light source package structure according to claim 2, wherein the active molecular surface includes at least one of an ester group, a carboxyl group, and a hydroxyl group, and the adhesive includes at least one of an epoxy group and a hydroxyl group that forms a chemical bond with the active molecular surface.

4. The light source package structure according to claim 2, wherein the active molecular surface is formed by treating the inside wall of the at least one accommodating groove with a UV treatment or a UV ozone treatment.

5. The light source package structure according to claim 4, wherein the UV treatment or the UV ozone treatment is implemented by using a UV light having a wavelength of 180-365 nm, and an irradiation energy of the UV light is greater than an energy of at least one of a carbon-carbon bond (C—C), a carbon-hydrogen bond (C—H), and a carbon-carbon bond ($\pi$—$\pi$*) in a benzene ring of the liquid crystal polymer.

6. The light source package structure according to claim 1, wherein the number of the at least one accommodating groove of the surrounding wall is two, and the adhesive is disposed inside of the two accommodating grooves, wherein the surrounding wall includes two inclined surfaces that are respectively connected to the upper riser surface and the lower tread surface, and the two inclined surfaces are respectively connected to two opposite sides of the lower tread surface, wherein one side of each of the two inclined surfaces is connected to the lower tread surface to form an angle greater than 90 degrees, and the other side of each of the two inclined surfaces and the upper riser surface jointly form one of the two accommodating grooves that has an angle less than 90 degrees.

7. The light source package structure according to claim 1, further comprising:
   a die-bonding adhesive layer bonded between the light emitting unit and the upper electrode layer, wherein the die-bonding adhesive layer has at least one pore extending inwardly from an outer surface thereof; and
   a protective layer attached to an outer surface of the die-bonding adhesive layer and extending inwardly into the at least one pore, wherein the protective layer is filled within a part or an entirety of the at least one pore.

8. The light source package structure according to claim 7, wherein the die-bonding adhesive layer is a sintered adhesive.

9. The light source package structure according to claim 7, wherein a material of the protective layer is an organic material, an inorganic material, or an inorganic/organic hybrid material and the protective layer has thermostability when the temperature is larger than 150° C.

10. The light source package structure according to claim 1, wherein the light emitting unit is a vertical cavity surface emitting laser (VCSEL) or an infrared LED.

11. The light source package structure according to claim 10, wherein the vertical cavity surface emitting laser includes an insulation protection layer coated on a surface thereof and a distributed Bragg reflector (DBR) arranged under the insulation protection layer.

12. The light source package structure according to claim 1, wherein the light permeable element is spaced apart from the upper riser surface with an interval.

13. The light source package structure according to claim 1, wherein at least one of a glass fiber, a titanium dioxide, and a silicon dioxide is added into the liquid crystal material.

14. The light source package structure according to claim 1, wherein the adhesive is an epoxy-based UV adhesive,
   a light emitting unit mounted on the upper electrode layer and disposed inside of the receiving space;
   an adhesive disposed in the at least one accommodating groove; and
   a light permeable element disposed on the lower tread surface, wherein the light permeable element is fixed on the surrounding wall by the adhesive.

15. A light source package structure, comprising:
   a substrate including a first surface and a second surface that is opposite to the first surface;
   an upper electrode layer disposed on the first surface of the substrate;
   a surrounding wall disposed on the first surface, and the surrounding wall having a step structure, the surrounding wall including:
      an upper tread surface arranged away from the substrate;
      an upper riser surface connected to an inner edge of the upper tread surface;
      a lower tread surface disposed at an inner side of the upper riser surface;
      at least one accommodating groove disposed between the upper riser surface and an outer edge of the lower tread surface; and
      a lower riser surface connected to an inner edge of the lower tread surface and arranged away from the upper tread surface, wherein the lower riser surface and the first surface jointly define a receiving space;

a light emitting unit mounted on the upper electrode layer and disposed inside of the receiving space; and an adhesive disposed in the at least one accommodating groove;

wherein the surrounding wall has at least one notch that is recessed from the lower tread surface and the lower riser surface and that is in spatial communication with the receiving space, and the at least one notch defines an air flow channel that is in spatial communication with the receiving space and an external space.

16. The light source package structure according to claim 15, further comprising a light permeable element disposed on the lower tread surface, wherein the light permeable element is fixed on the surrounding wall by the adhesive.

17. The light source package structure according to claim 16, wherein the light permeable element is spaced apart from the upper riser surface with an interval.

18. The light source package structure according to claim 15, wherein the number of the at least one accommodating groove of the surrounding wall is two, and the adhesive is disposed inside of the two accommodating grooves.

19. The light source package structure according to claim 18, wherein the surrounding wall includes two inclined surfaces that are respectively connected to the upper riser surface and the lower tread surface, and the two inclined surfaces are respectively connected to two opposite sides of the lower tread surface, wherein one side of each of the two inclined surfaces is connected to the lower tread surface to form an angle greater than 90 degrees, and the other side of each of the two inclined surfaces and the upper riser surface jointly form one of the two accommodating grooves that has an angle less than 90 degrees.

20. The light source package structure according to claim 15, wherein the light emitting unit is a vertical cavity surface emitting laser (VCSEL) or an infrared LED.

* * * * *